US008842442B2

(12) United States Patent
Yang et al.

(10) Patent No.: US 8,842,442 B2
(45) Date of Patent: Sep. 23, 2014

(54) ELECTRONIC SYSTEM AND GUIDE PIN DEVICE THEREOF

(75) Inventors: Chun-Ying Yang, Taipei (TW); Chi-Cheng Hsiao, Taipei (TW)

(73) Assignee: Inventec Corporation, Taipei (TW)

( * ) Notice: Subject to any disclaimer, the term of this patent is extended or adjusted under 35 U.S.C. 154(b) by 173 days.

(21) Appl. No.: 13/441,938

(22) Filed: Apr. 9, 2012

(65) Prior Publication Data

US 2013/0163217 A1 Jun. 27, 2013

(30) Foreign Application Priority Data

Dec. 21, 2011 (TW) ............................ 100147770 A

(51) Int. Cl.
*H05K 1/11* (2006.01)
*H05K 1/14* (2006.01)

(52) U.S. Cl.
USPC .......................................... 361/786; 361/759

(58) Field of Classification Search
CPC ........ B21D 22/00; B21D 22/04; B21D 37/02; H01R 12/7052; H01R 12/732; H05K 7/00; H05K 7/1487
USPC .......... 361/786, 759, 728, 752, 802; 439/680, 439/681, 65, 78, 676, 181, 186
See application file for complete search history.

(56) References Cited

U.S. PATENT DOCUMENTS

| | | | | |
|---|---|---|---|---|
| 4,820,169 | A * | 4/1989 | Weber et al. | 439/65 |
| 6,405,413 | B2 * | 6/2002 | Ichimaru et al. | 24/297 |
| 6,632,107 | B1 * | 10/2003 | Vanbesien | 439/680 |
| 7,186,121 | B1 * | 3/2007 | Costello et al. | 439/79 |
| 7,997,938 | B2 * | 8/2011 | Costello et al. | 439/660 |
| 2006/0141847 | A1 * | 6/2006 | Ngo | 439/378 |
| 2013/0178079 | A1 * | 7/2013 | Yang et al. | 439/78 |
| 2013/0240695 | A1 * | 9/2013 | Chaung | 248/220.22 |

* cited by examiner

*Primary Examiner* — Yuriy Semenenko
(74) *Attorney, Agent, or Firm* — CKC & Partners Co., Ltd.

(57) ABSTRACT

An electronic system includes a first circuit board having a first connection interface, and a second circuit board having a second connection interface and a guide pin device. The guide pin device includes a convex connector and a concave connector. The convex connector includes a guide member and a connection portion. The connection portion connects the guide member to the first circuit board and has two first inclined surfaces formed on two opposite sides of the guide member. The concave connector is secured on the second circuit board and includes a guide sliding slot and two second inclined surfaces formed on two opposite sides of the guide sliding slot. When the guide member is aligned with and is inserted into the guide sliding slot, the two first inclined surfaces mat with the two second inclined surfaces, and the first connection interface is engaged with the second connection interface.

8 Claims, 3 Drawing Sheets

1

ELECTRONIC SYSTEM AND GUIDE PIN DEVICE THEREOF

RELATED APPLICATIONS

This application claims priority to Taiwan Application Serial Number 100147770, filed Dec. 21, 2011, which is herein incorporated by reference.

BACKGROUND

1. Field of Invention

The present invention relates to a connection device. More particularly, the present invention relates to an electronic system and a guide pin device thereof.

2. Description of Related Art

Electronic devices have become indispensable data processing and communication tools in modern people's lives. By using various electronic devices such as desktop computers, handheld electronic devices or tablets, a user can compute and process data or access data over the network rapidly.

However, a complicated electronic device often needs different circuit connections for achieving better and more powerful operation effects. When circuits are formed on different circuit boards, a connection mechanism is particularly required to combine the circuit boards into a whole electronic system. If a well-designed guide method is provided, the connection efficiency between the circuit boards will be significantly improved.

Therefore, those who are in this industry are endeavoring to find ways to design a novel electronic system and a guide pin device thereof for providing a guide mechanism of quick alignment and connection.

SUMMARY

Accordingly, this disclosure provides a guide pin device, which includes a convex connector and a concave connector. The convex connector includes a guide member and a connection portion. The connection portion connects the guide member to the first circuit board, and has two first, inclined surfaces formed on two opposite sides of the guide member. The concave connector is secured on second circuit board and further includes a guide sliding slot and two second inclined surfaces. The two second inclined surfaces are formed on two opposite sides of the guide sliding slot, and each of the second inclined surfaces has an inclined corner corresponding to one of the two first inclined surfaces. When the guide member of the convex connector is aligned with and is inserted into the guide sliding slot of the concave connector, the two first inclined surfaces mate with the two second inclined surfaces, and the first connection interface of the first circuit board is engaged with the second connection interface of the second circuit board.

According to an embodiment of this disclosure, when the first connection interface of the first circuit board is engaged with the second connection interface of the second circuit board, the first circuit board and the second circuit board are connected in parallel to each other.

According to another embodiment of this disclosure, when the first connection interface of the first circuit board is engaged with the second connection interface of the second circuit board, the first circuit board and the second circuit board are connected in perpendicular to each other.

According to still another embodiment of this disclosure, the guide member is of a column shape.

According to yet another embodiment of this disclosure, the guide sliding slot has a first guide sliding slot segment and a second guide sliding slot segment. The second guide sliding slot segment has a first end and a second end. The first end is held in the first guide sliding slot segment, and the second end is formed with an opening of which a hole diameter greater than a hole diameter of the first end, such that the guide member is inserted into the guide sliding slot via the opening.

According to a further embodiment of this disclosure, the connection portion of the convex connector further has two securing plates formed on two sides of the two first inclined surfaces. When the guide member of the convex connector is aligned with and is inserted into the guide sliding slot of the concave connector and the two first inclined surfaces mate with the two second inclined surfaces, the two securing plates fit to two sides of the concave connector.

According to still a further embodiment of this disclosure, the inclined corners of the two second inclined surfaces are obtained by a tolerance analysis computation.

According to an embodiment of this disclosure, a contact surface of the concave connector contacting the second circuit board is formed with at least one securing pin that is correspondingly inserted into at least one securing hole of the second circuit board.

This disclosure also provides an electronic system, which includes a first circuit board, a second circuit board and a guide pin device. The first circuit board includes a first connection interface. The second circuit board includes a second connection interface. The guide pin device includes a convex connector and a concave connector. The convex connector includes a guide member and a connection portion, The connection portion connects the guide member to the first circuit board and has two first inclined surfaces formed on two opposite sides of the guide member. The concave connector is secured on the second circuit board and further includes a guide sliding slot and two second inclined surfaces. The two second inclined surfaces are formed on two opposite sides of the guide sliding slot, and each of the second inclined surfaces has an inclined corner corresponding to one of the two first inclined surfaces. When the guide member of the convex connector is aligned with and is inserted into the guide sliding slot of the concave connector, two first inclined surfaces mate with the two second inclined surfaces, and the first connection interface of the first circuit board is engaged with the second connection interface of the second circuit board.

The application of this disclosure is advantageous in that the guide member and the first inclined surfaces of the convex connector are connected with and mate with the guide sliding slot and the second inclined surfaces of the concave connector, such that the connection interfaces of the first and the second circuit boards are jointed together, thereby achieving the guiding effect.

BRIEF DESCRIPTION OF THE DRAWINGS

In order to make the following as well as other aspects, features, advantages, and embodiments of the present invention more apparent, the accompanying drawings are described as follows.

DETAILED DESCRIPTION

Figure 1:
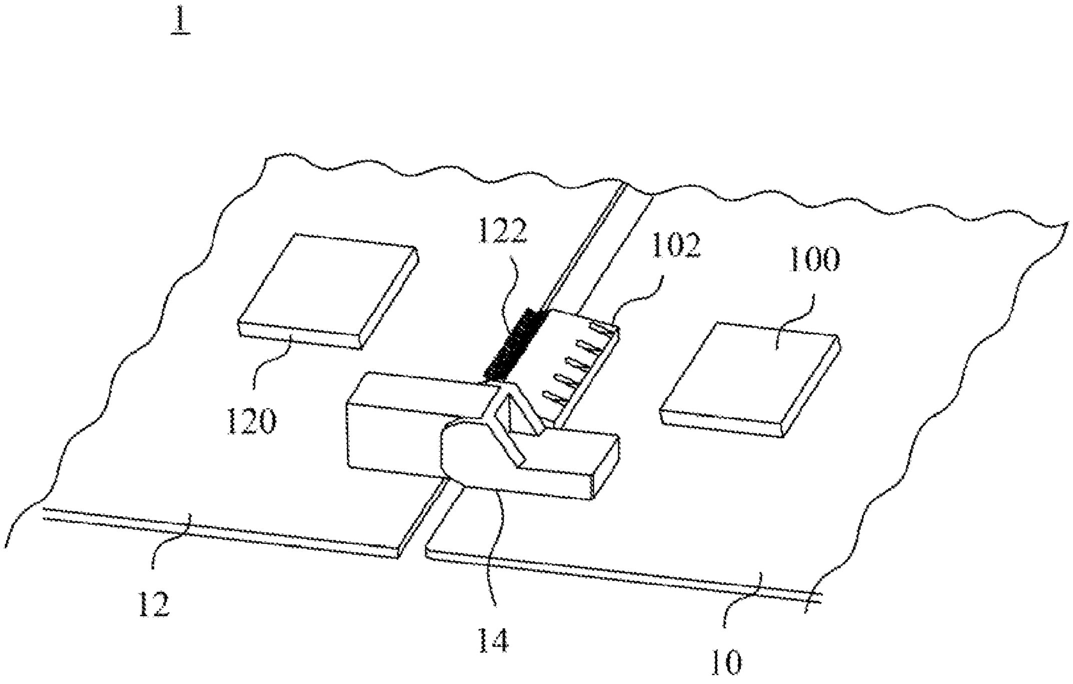
FIG. 1 is a 3-D view illustrating an electronic system according to an embodiment of this disclosure.

FIG. 1 is a 3-D view illustrating an electronic system 1 according to an embodiment of this disclosure. Referring to FIG. 1, the electronic system 1 includes a first circuit board 10, a second circuit board 12 and a guide pin device 14.

The first circuit board 10 may include at least one circuit module 100 and a first connection interface 102. The second circuit board 12 includes at least one circuit module 120 and a second connection interface 122. To substantially electrically connect the first circuit board 10 to the second circuit board 12, the first connection interface 102 and the second connection interface 122 can be connection interfaces of the same specification. For example, the first connection interface 102 and the second connection interface 122 can be data transfer interfaces such as peripheral component interconnect express (PCIE) and small computer system interface (SCSI), so that when the first circuit board 10 is substantially electrically connected to the second circuit board 12, the circuit module 100 and the circuit module 120 can communicate with each other by the first connection interface 102 and the second connection interface 122.

Figure 2:
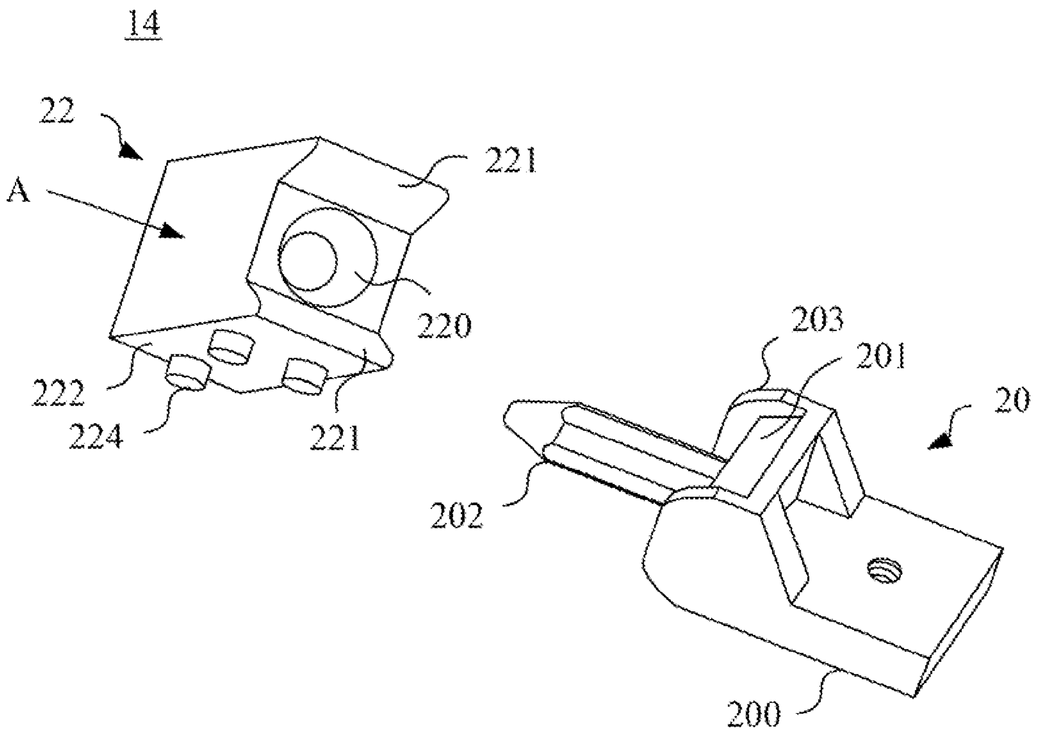
FIG. 2 is a detailed 3-D view illustrating a guide pin device of FIG. 1 according to an embodiment of this disclosure.

FIG. 2 is a detailed 3-D exploded view illustrating a guide pin device 14 in FIG. 1 according to an embodiment of this disclosure. Referring to FIG. 2 at the same time, the guide pin device 14 includes a convex connector 20 and a concave connector 22.

The convex connector 20 includes a connection portion 200 and a guide member 202. The connection portion 200 is used to connect the guide member 202 to the first circuit board 10. The connection portion 200 has two first inclined surfaces 201 formed on two opposite sides of the guide member 202. It should be noted that due to the draft angle limit, only one of the first inclined surfaces 201 can be shown in FIG. 2.

The concave connector 22 includes a guide sliding slot 220 and is secured on the second circuit board 12. In an embodiment, the contact surface 222 of the concave connector 22 contacting the second circuit board 12 is formed with securing pins 224 that are correspondingly inserted into securing holes (not shown) of the second circuit board 12, so as to increase the guiding stability. The concave connector 22 further includes two second inclined surfaces 221. The two second inclined surfaces 221 are formed on two opposite sides of the guide sliding slot 220 and each of the second inclined surfaces 221 has an inclined corner corresponding to one of the two first inclined surfaces 201 of the connection portion 200 of the convex connector 20. In an embodiment, the inclined corners of the first inclined surfaces 201 and the second inclined surfaces 221 may be obtained by a tolerance analysis computation, so as to achieve the optimal guiding effect. In this embodiment, the first inclined surfaces 201 are outer inclined surfaces and the second inclined surfaces 221 are inner inclined surfaces, so that the first and the second inclined surfaces have matching shapes and inclined corners.

Therefore, before the first connection interface 102 of the first circuit board 10 is engaged with the second connection interface 122 of the second circuit board 12, the guide member 200 of the convex connector 20 is aligned with and is inserted into the guide sliding slot 220 of the concave connector 22, and thereafter, the first inclined surfaces 201 and second inclined surfaces 221 having the matching inclined corners are secured, thereby achieving the guiding effect. After the convex connector 20 and the concave connector 22 are positioned and combined, the first connection interface 102 of the first circuit board 10 can be engaged with the second connection interface 122 of the second circuit board 12, such that a substantially electrical connection is generated between the circuit module 100 of the first circuit board 10 and the circuit module 120 of the second circuit board 12, as shown in FIG. 1.

Figure 3:
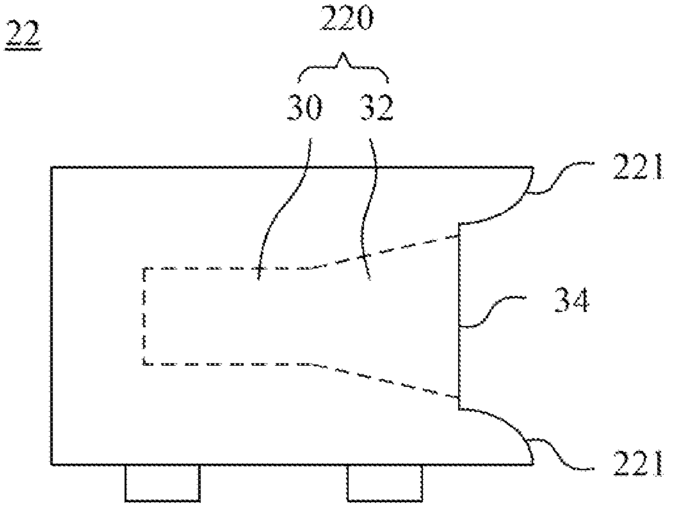
FIG. 3 is a lateral cross-sectional view of a concave connector taken along an A direction in FIG. 2 according to an embodiment of this disclosure.

In an embodiment, the connection portion 200 of the convex connector 20 further has two securing plates 203 formed on two sides of the first inclined surfaces 201. When the guide member 200 of the convex connector 20 is aligned with and inserted into the guide sliding slot 200 of the concave connector 22; and the first inclined surfaces 201 are inserted into the second inclined surfaces 221, the securing plates 203 are engaged with two sides of the concave connector 22 as shown in FIG. 1, thereby achieving better securing and guiding effects. In an embodiment, the guide member 200 may be of a column shape, and the guide sliding slot 220 may have a matching shape, so that the guide member 200 can be engaged with the guide sliding slot 220. Referring to FIG. 3, FIG. 3 is a lateral cross-sectional view of a concave connector 22 taken along an A direction in FIG. 2 according to an embodiment of this disclosure. In this embodiment, the guide sliding slot 220 of the concave connector 22 has a first guide sliding slot segment 30 and a second guide sliding slot segment 32. The second guide sliding slot segment 32 has a first end and a second end. The first end is held in the first guide sliding slot segment 30, and the second end is formed with an opening 34 of which a hole diameter is greater than a hole diameter of the first end, so that the guide member 200 can be inserted into the guide sliding slot 220 via the opening 34. Therefore, the guide member 200 can be successfully inserted into the guide sliding slot 220 by firstly being inserted into the second guide sliding slot segment 32 with a larger hole diameter and then being guided to the first guide sliding slot segment 30 with a smaller hole diameter via the second guide sliding slot segment 32.

It should be noted that in the embodiment of FIG. 1, when the first connection interface 102 of the first circuit board 10 is engaged with the second connection interface 122 of the second circuit board 12, the first circuit board 10 and the second circuit board 12 are connected in parallel to each other.

Figure 4:
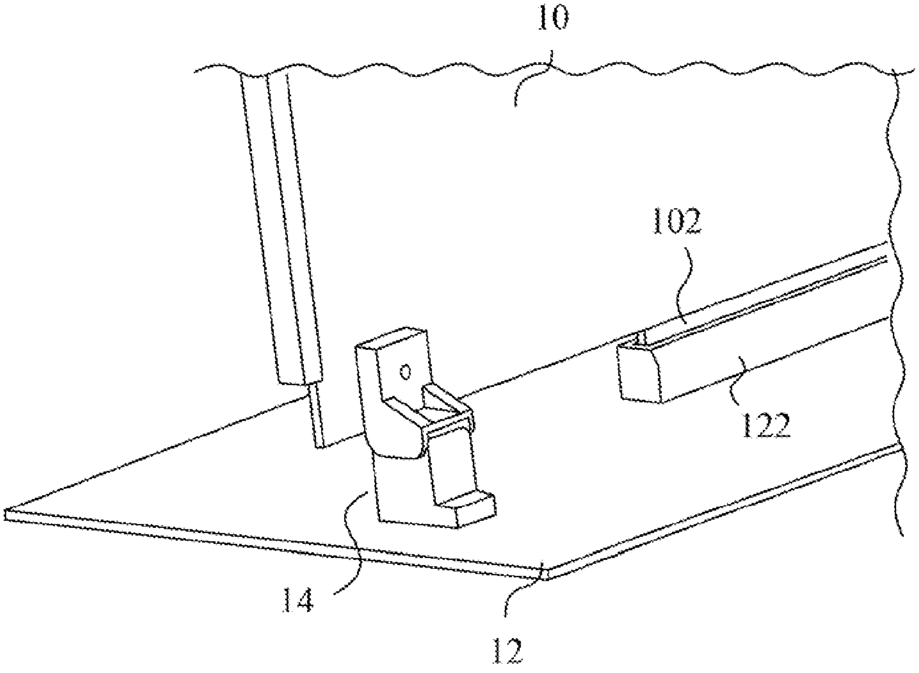
FIG. 4 is a 3-D view illustrating a first circuit board connected to a second circuit board of the electronic system according to another embodiment of this disclosure.
Figure 5:
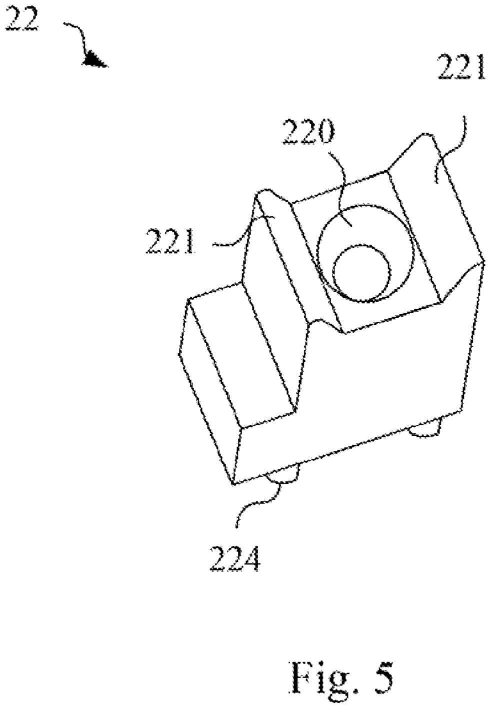
FIG. 5 is a 3-D view illustrating a concave connector of the guide pin device shown in FIG. 4 according to another embodiment of this disclosure.

Referring to FIG. 4, FIG. 4 is a 3-D view illustrating the first circuit board 10 connected to the second circuit board 12 of the electronic system 1 according to another embodiment of this disclosure. In this embodiment, when the first connection interface 102 of the first circuit board 10 is engaged with the second connection interface 122 of the second circuit board 12, the first circuit board 102 and the second circuit board 122 are connected in perpendicular to each other. Referring to FIG. 5 at the same time, FIG. 5 is a 3-D view illustrating a concave connector of the guide pin device shown in FIG. 4 according to another embodiment of this disclosure. In this embodiment, the guide member 202 extends in a direction parallel to the plane of the first circuit board 10, and the guide sliding slot 220 extends in a direction perpendicular to the plane of the second circuit board 12. In another embodiment, the guide member 202 may also extend in a direction perpendicular to the plane of the first circuit board 10, and the guide sliding slot 220 may extend in a direction parallel to the plane of the second circuit board 12, thereby achieving the effect that the first circuit board 102 and the second circuit board 122 are connected in perpendicular to each other.

The application of this disclosure is advantageous in that the guide member and the first: inclined surfaces of the convex connector are connected with and mat. with the guide sliding slot and the second inclined surfaces of the concave connector, such that the connection interfaces of the first and the second circuit boards are jointed together, thereby achieving the guiding effect.

Although the present invention has been disclosed with reference to the embodiments, these embodiments are not intended to limit the present invention. It will be apparent to those skilled in the art that various modifications and variations can be made without departing from the scope or spirit of the present invention. Therefore, the scope of the present invention shall be defined by the appended claims.

What is claimed is:

1. A guide pin device, comprising:
- a convex connector, comprising:
  - a guide member; and
  - a connection portion for connecting the guide member to a first circuit board, wherein the connection portion has two first inclined surfaces formed on two opposite sides of the guide member; and
- a concave connector secured on a second circuit board, the concave connector further comprising:
  - a guide sliding slot; and
  - two second inclined surfaces formed on two opposite sides of the guide sliding slot, each of the second inclined surfaces having an inclined corner corresponding to one of the two first inclined surfaces, wherein the inclined corners of the two second inclined surfaces are obtained by a tolerance analysis computation;
- wherein when the guide member of the convex connector is aligned with and is inserted into the guide sliding slot of the concave connector, the two first inclined surfaces mate with the two second inclined surfaces, and a first. connection interface of the first circuit board is engaged with a second connection interface of the second circuit board.

2. The guide pin device of claim 1, wherein when the first connection interface of the first circuit board is engaged with the second connection interface of the second circuit board, the first circuit board and the second circuit hoard are connected in parallel to each other.

3. The guide pin device of claim 1, wherein when the first connection interface of the first circuit board is engaged with the second connection interface of the second circuit board, the first circuit board and the second circuit board are connected in perpendicular to each other.

4. The guide pin device of claim 1, wherein the guide member is of a column shape.

5. The guide pin device of claim 1, wherein the guide sliding slot has a first guide sliding slot segment and a second guide sliding slot segment, and the second guide sliding slot, segment has a first end and a second end, and the first end is held in the first guide sliding slot segment, and the second end is formed with an opening of which a hole diameter is greater than a hole diameter of the first end, such that the guide member is inserted into the guide sliding slot via the opening.

6. The guide pin device of claim 1, wherein the connection portion of the convex connector further has two securing plates formed on two sides of the two first inclined surfaces, and when the guide member of the convex connector is aligned with and is inserted into the guide sliding slot of the concave connector, and the two first inclined surfaces mate with the two second inclined surfaces, the two securing plates are fit to two sides of the concave connector.

7. The guide pin device of claim 1, wherein a contact surface of the concave connector contacting the second circuit board is formed with at least one securing pin that is correspondingly inserted into at least one securing hole of the second circuit board.

8. An electronic system, comprising:
- a first circuit board comprising a first connection interface;
- a second circuit board comprising a second connection interface; and
- a guide pin device, comprising:
  - a convex connector, comprising:
    - a guide member; and
    - a connection portion for connecting the guide member to the first circuit board, wherein the connection portion has two first inclined surfaces formed on two opposite sides of the guide member; and
  - a concave connector secured on the second circuit board and further comprising:
    - a guide sliding slot; and
    - two second inclined surfaces formed on two opposite sides of the guide sliding slot, each of the second inclined surfaces having an inclined corner corresponding to one of the two first inclined surfaces, wherein the inclined corners of the two second inclined surfaces are obtained by a tolerance analysis computation;
- wherein when the guide member of the convex connector is aligned with and is inserted into the guide sliding slot of the concave connector; and, the two first inclined surfaces mate with the two second inclined surfaces, and the first connection interface of the first circuit board is engaged with the second connection interface of the second circuit board.

* * * * *